United States Patent
Wall (10) Patent No.: US 10,474,768 B2
(45) Date of Patent: Nov. 12, 2019

(54) SENSOR-BASED FACILITY ENERGY MODELING

(71) Applicant: SCHNEIDER ELECTRIC USA, INC., Andover, MA (US)

(72) Inventor: Daniel J. Wall, Saanichton (CA)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 23 days.

(21) Appl. No.: 15/034,930

(22) PCT Filed: Nov. 8, 2013

(86) PCT No.: PCT/US2013/069229
§ 371 (c)(1),
(2) Date: May 6, 2016

(87) PCT Pub. No.: WO2015/069278
PCT Pub. Date: May 14, 2015

(65) Prior Publication Data
US 2016/0292321 A1    Oct. 6, 2016

(51) Int. Cl.
G06G 7/54 (2006.01)
G06F 17/50 (2006.01)
G01R 22/10 (2006.01)
G06N 7/00 (2006.01)
G06Q 10/06 (2012.01)
G06Q 50/06 (2012.01)

(52) U.S. Cl.
CPC ......... *G06F 17/5009* (2013.01); *G01R 22/10* (2013.01); *G06N 7/005* (2013.01); *G06Q 10/0639* (2013.01); *G06Q 50/06* (2013.01); *Y02P 90/82* (2015.11)

(58) Field of Classification Search
CPC ....... G06F 17/5009; G06F 1/32; G01R 22/10; G06Q 10/0639; G06Q 50/06
USPC .......................................................... 703/18
See application file for complete search history.

(56) References Cited

U.S. PATENT DOCUMENTS 8,194,914 B1    6/2012    Skogg et al.
8,355,827 B2    1/2013    Egnor et al.
(Continued)

FOREIGN PATENT DOCUMENTS

CN    102054123 A    5/2011
CN    102985890 A    3/2013

OTHER PUBLICATIONS

Maile et al. (Building Energy Performance Simulation Tools—a Life-Cycle and Interoperable Perspective, 2007 (49 pages)).*
(Continued)

*Primary Examiner* — Andre Pierre Louis
(74) *Attorney, Agent, or Firm* — Lando & Anastasi, LLP (57) ABSTRACT

According to various aspects and embodiments, a system directed to measuring, evaluating and improving building energy efficiency. The system includes a memory and at least one processor coupled to the memory and configured to provide instructions for capturing information pertaining to a facility, receive, from a mobile device, at least one portion of the information pertaining to the facility, the at least one portion of the information including at least one image of the facility, process the at least one image of the facility to identify elements related to energy usage of the facility; and generate, based at least on the elements, a model of the facility.

13 Claims, 3 Drawing Sheets

(56) References Cited

U.S. PATENT DOCUMENTS

| | | |
|---|---|---|
| 2011/0095897 A1 | 4/2011 | Sutrave |
| 2011/0251807 A1* | 10/2011 | Rada .................... G01D 4/00 |
| | | 702/61 |
| 2012/0022700 A1* | 1/2012 | Drees ................ G05B 15/02 |
| | | 700/276 |
| 2012/0084063 A1* | 4/2012 | Drees ................ G06Q 10/06 |
| | | 703/6 |
| 2012/0166616 A1 | 6/2012 | Meehan et al. |
| 2013/0016175 A1 | 1/2013 | Alberth et al. |
| 2013/0050511 A1 | 2/2013 | Derby et al. |
| 2014/0316584 A1* | 10/2014 | Matsuoka ......... G05D 23/1917 |
| | | 700/278 |

OTHER PUBLICATIONS

4 Innovative Startups that Lower Costs of Commerical Energy Audits / GreenBiz.com; 2013 GreenBiz Group; pp. 1-3.
EcoINSIGHT—It's Time to Give Excel a Rest—Goodbye cumbersome spreadsheets. Hello Better.; Auditor-Energy Audits! Energy Audit & Analysis; 2012 ecoInsight; pp. 1-2.
IndoorAtlas Web page, Jul. 9, 2013, pp. 1-3.
KWhOURS—FIELD for iPad; 2013 kWhOURS, Inc.; pp. 1-2.
Notification of Transmittal of the International Search Report and the Written Opinion of the International Searching Authority from corresponding PCT/US2013/069229 dated May 7, 2014.
Wikipedia—Outline of object recognition, Jul. 9, 2013, pp. 1-9.

* cited by examiner

SENSOR-BASED FACILITY ENERGY MODELING

CROSS-REFERENCE TO RELATED APPLICATIONS

This application is a U.S. National Stage Application under 35 U.S.C. § 371 of International Application No. PCT/US2013/069229, filed Nov. 8, 2013, titled SENSOR-BASED FACILITY ENERGY MODELING, which is hereby incorporated herein by reference in its entirety.

BACKGROUND

Field of Invention

Aspects disclosed herein relate to systems and methods for modeling energy usage of a facility.

Discussion of Related Art

Assessing the energy performance of a building often starts with an on-site energy audit and can involve a site walk-through. During this walk-through an energy management professional identifies energy loads and may determine an operating schedule for the building. The energy audit can be used to generate a baseline model of energy usage of the building. Such models can be used to determine ways in which energy efficiency can be improved.

SUMMARY OF THE DISCLOSURE

At least some embodiments of the disclosure are directed to measuring, evaluating, and improving building energy efficiency. The system includes a memory and at least one processor coupled to the memory and configured to provide instructions for capturing information pertaining to a facility, receive, from a mobile device, at least one portion of the information pertaining to the facility, the at least one portion of the information including at least one image of the facility, process the at least one image of the facility to identify elements related to energy usage of the facility; and generate, based at least on the elements, a model of the facility.

In the system, the at least one processor may further configured to generate at least one confidence measure of a correct identification of the elements. The at least one processor may be further configured to generate, based on the at least one confidence measure, additional instructions for capturing additional information pertaining to the facility, and provide the additional instructions to the mobile device.

In the system, the at least one processor may be further configured to receive information pertaining to energy usage of the facility, and generate, based on the model of the facility and the information pertaining to energy usage of the facility, an energy performance model of the facility. The at least one processor may be configured to receive information pertaining to energy usage of the facility by at least receiving information generated by a utility company.

In the system, the at least one processor may further configured to provide data for displaying energy performance information on a user device, the energy performance information being superimposed on one or more elements as the user device receives image data from a camera and shows the element on a display of the user device.

In the system, the at least one processor may be configured to process the at least one video by at least identifying characteristics of the elements. In the system, the at least one portion of the information may further include audio comprising words descriptive of at least one of the elements.

According to another embodiment, a computer-implemented method is provided. The method includes acts of providing instructions for capturing information pertaining to a facility, receiving, from a mobile device, at least one portion of the information pertaining to the facility, the at least one portion of the information including at least one image of the facility, processing, on a computer, the at least one image of the facility to identify elements related to energy usage of the facility, and generating, based at least on the elements, a model of the facility.

The method may further comprise an act of generating at least one confidence measure of a correct identification of the elements. In addition, the method may include acts of generating, based on the at least one confidence measure, additional instructions for capturing additional information pertaining to the facility, and providing the additional instructions to the mobile device.

The method may further include acts of receiving information pertaining to energy usage of the facility, and generating, based on the model of the facility and the information pertaining to energy usage of the facility, an energy performance model of the facility.

In the method, the act of receiving information pertaining to energy usage of the facility may comprise receiving information generated by a utility company. In addition, the act of providing data for displaying energy performance information on a user device may include the energy performance information being superimposed on one or more elements as the user device receives image data from a camera and shows the element on a display of the user device. The act of processing the at least one video may comprise identifying characteristics of the elements.

In the method, the at least one portion of the information further includes audio comprising words descriptive of at least one of the elements.

According to another embodiment, a non-transitory computer readable medium storing computer readable instructions is provided. The computer readable instructions, when executed by at least one processor, instruct the at least one processor to perform a method of providing information regarding a power system comprising power system elements. The method includes acts of providing instructions for capturing information pertaining to a facility, receiving, from a mobile device, at least one portion of the information pertaining to the facility, the at least one portion of the information including at least one image of the facility, processing, on a computer, the at least one image of the facility to identify elements related to energy usage of the facility, and generating, based at least on the elements, a model of the facility.

The method may further include generating at least one confidence measure of a correct identification of the elements. In addition, the method may further comprise the acts of generating, based on the at least one confidence measure, additional instructions for capturing additional information pertaining to the facility, and providing the additional instructions to the mobile device.

The method may further include acts of receiving information pertaining to energy usage of the facility, and generating, based on the model of the facility and the information pertaining to energy usage of the facility, an energy performance model of the facility.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed subject matter. Particular references to examples and embodiments, such as "an embodiment," "an example," "another embodiment," "another example," "some embodiments," "some examples," "other embodiments," "an alternate embodiment," "various embodiments," "one embodiment," "at least one embodiment," "this and other embodiments" or the like, are not necessarily mutually exclusive and are intended to indicate that a particular feature, structure, or characteristic described in connection with the embodiment or example and may be included in that embodiment or example and other embodiments or examples. The appearances of such terms herein are not necessarily all referring to the same embodiment or example.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Some embodiments disclosed herein include systems and methods for modeling energy usage of facilities. Modeling energy usage can involve an energy audit of the facility. Some of the information used in generating an initial energy audit can be gathered by a walkthrough of the facility and visually identifying various features. Rather than an auditor conducting the walkthrough, information can be received from users that can be used to identify the various features. For example, users can walk through the facility using mobile computing devices or other sensors to take pictures or videos of the facility or to collect other sensor information descriptive of the facility. Sensors that may be used to collect sensor information descriptive of a facility include infrared heat sensors, acoustic sensors, WIFI sensors, air flow sensors, humidity sensors, air pressure sensors, EMF sensors, and x-ray sensors. Each of these sensors may, in some embodiments, be coupled to a GPS component to provide specific location information in conjunction with the other sensor information collected by the sensor. The energy modeling system can receive and analyze the pictures, videos, and other sensor information to detect elements related to energy usage. The energy modeling system can also receive additional information from the users, as well as request additional information based on the information received. The information received from the users can be used to generate a model of energy usage and efficiency of the facility. The model can also be used to provide suggestions for improving energy efficiency of the facility.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Figure 1:
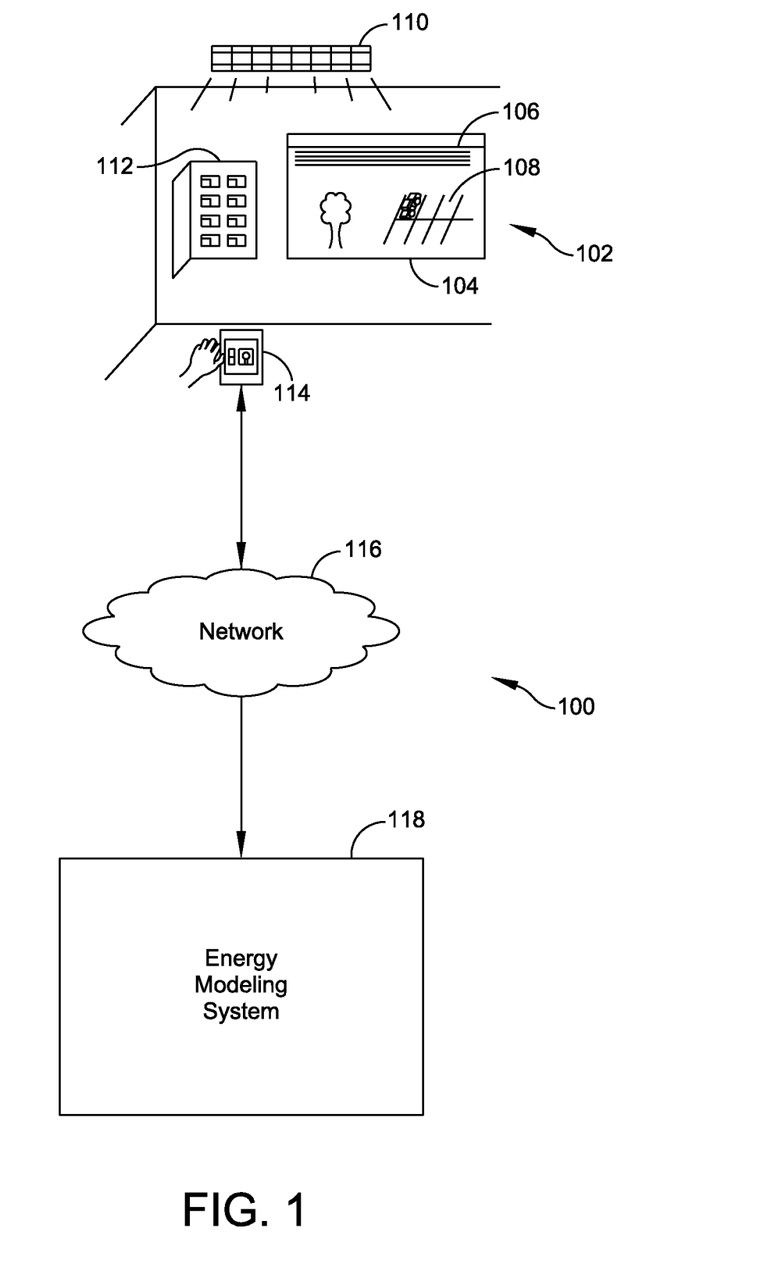
FIG. 1 is a diagram showing an example energy modeling system.

FIG. 1 shows an example environment 100 in which an energy modeling system 118 can be implemented. The energy modeling system 118 can be accessed via a network 116 by a user device 114. The user device 114 can be used to gather information about a facility 102. For example, the facility 102 can include elements related to energy usage, such as windows 104, a lighting system 110, and a circuit panel 112.

The user device 114 can be any device that includes a processor, a sensor (e.g., a camera), and a mechanism for communicating with the network 116. For example, the user device 114 can be a mobile computing device such as a smart phone or a tablet computer. The network 116 can include any communication network through which computer systems send and receive information. For example, the network 116 can be a public network, such as the internet, and can include other public or private networks such as LANs, WANs, extranets, and internets.

The energy modeling system 118 can be implemented using one or more computer systems, such as a distributed computer system 300 discussed below with reference to FIG. 3. Examples of the energy modeling system 118 can include a variety of hardware and software components configured to perform the functions described herein and examples are not limited to a particular hardware component, software component, or particular combination thereof. It should be understood that the one or more computer systems can be hosted in a cloud-based service providing energy modeling for any number of users for any number of facilities.

In addition, information may flow between the elements, components and subsystems described herein using a variety of techniques. Such techniques include, for example, passing the information over the network 116 using standard protocols, such as TCP/IP, passing the information between modules in memory and passing the information by writing to a file, database, or some other non-volatile storage device. In addition, pointers, identifiers, or other references to information may be transmitted and received in place of, or in addition to, copies of the information. Conversely, the information may be exchanged in place of, or in addition to, pointers, identifiers, or other references to the information. Other techniques and protocols for communicating information may be used without departing from the scope of the examples disclosed herein.

The facility 102 can be a building such as an office building or a data center. The facility 102 includes elements and properties related to energy usage. The elements can include elements that provide energy such as generators, power feeds, and other power sources. The elements can also include elements that use energy such as lighting systems, motors, computers, heating, ventilation, and air conditioning (HVAC) systems, and other energy loads. The elements can also include elements that affect energy usage, such as windows, blinds, and overhangs. Properties can include characteristics of the facility 102 or associated with the facility 102 that affect energy usage, such as building size, space configuration, building occupancy, thermostat settings, surrounding buildings and landscape, and other such properties.

In some embodiments, the user device 114 can be used to capture information pertaining to the facility 102. For example, the user device 114 can capture images or video of the facility 102. Videos can be a sequence of images. The images or video can be provided to the energy modeling system 118 via the network 116. In some embodiments, the user device 114 can also capture audio data and provide audiovisual data to the energy modeling system 118. Other embodiments may capture other information and the embodiments disclosed herein are not limited to a particular type of sensor information. The energy modeling system 118 can receive the information captured by the user device 114 and analyze the information. For example, the energy modeling system 118 can use image processing techniques on received images and videos to identify elements and properties related to energy usage.

In some embodiments, the user device 114 can send a video of a portion of the facility 102 as visible in FIG. 1. The energy modeling system 118 can process the video to identify the window 104, the blinds 106, the lighting system 110, the circuit panel 112, and a parking lot 108. For instance, the video or image of an element may include descriptive text (such as a nameplate). The energy modeling system 118 can extract such text using methods such as optical character recognition (OCR). Alternately or additionally, the energy modeling system may recognize an element in a processed image or video as being likely to contain such descriptive text (such as a motor) and may direct a user to revisit the recognized element to specifically capture such text. Once the energy modeling system 118 has recognized the nameplate information (via OCR or otherwise), the energy modeling system 118 can download more information about the asset (generator, motor, etc.) from the internet.

Additional information related to energy profiling can be extracted from some of these elements, information such as characteristics of the elements. For example, the video can be processed to determine a type of the window 104, such as single-pane or double-pane, a size of the window 104, a number of additional windows, a cardinal direction the window 104 is facing, and other such characteristics that can affect energy usage of the facility 102. Images or video of the lighting system 110 can be further analyzed to determine a type of the lighting system 110, a number of light fixtures of the lighting system 110 and other such characteristics. Images or video of the circuit panel 112 can be processed to extract information pertaining to electrical components of the facility 102. Images or video of the parking lot 108 can be processed to determine information such as a number of cars and spaces in the parking lot, which can provide information about properties of the facility 102 such as occupancy and capacity of the facility 102. Images or video of outside the facility 102 can also be analyzed to provide information about climate and weather. Other elements related to energy usage can be identified by processing images or video. For example, energy sources such as generators can be identified through image processing. Other elements such as computers, HVAC units, motors, elevators, and other loads can also be identified in images or videos.

In some embodiments, elements can be categorized by a functional type of the element. Each functional type can have a set of characteristics associated with the elements of the functional type. For example, windows can have characteristics such as type, size, quantity, and cardinal direction. Generators can have characteristics such as model number, output capacity, and output measurements. Some elements can provide information about properties of the facility 102, such as thermostats, which can provide temperature information such as current temperature of the facility 102 or target temperature of the facility 102. Another example can be a number of people in an image, which can provide occupancy information.

In some embodiments, the energy modeling system 118 can include a default set of elements and properties related to energy usage with a default set of characteristics for some or all of the elements and properties. The set of elements and properties as well as the set of characteristics can be configurable, for example, allowing addition of elements that affect energy usage in the facility. The sets can be configured by a user or by the system.

In some embodiments, the energy modeling system 118 can provide instructions to users for capturing information. For example, in some embodiments, the users can be users or residents of the facility to whom instructions can be provided on capturing images, video, or other sensor information. In some embodiments, the instructions can include a request for a general walkthrough of an entire or a portion of the facility 102. The instructions can include requests to capture images, video, or other sensor information descriptive of specific elements or providing information for specific properties, such as the default set of elements and properties. In some embodiments, instructions can be generated based on received information. For example, the energy modeling system 118 can receive images, video, or other sensor information descriptive of a general walkthrough of the facility 102. The energy modeling system 118 can analyze the images, video, or other sensor information descriptive of the general walkthrough to determine the elements and properties that can be identified in the images, video, or other sensor information. The energy modeling system 118 can determine elements and properties for which additional information is needed and generate requests for additional images, video or other sensor information to supply the additional information. For example, the energy modeling system 118 can receive an image of the window 104, but might require an additional image from a different angle to determine whether the window 104 is single or double-pane. The energy modeling system 118 can generate such a request and provide it as an instruction to the user or the user device 114.

In some embodiments, the instructions can be provided through an application on the user device 114. For example, the application can provide interactive instructions directing the user. For instance, the application can provide prompts, such as arrows, directing the user to walk down the hall to capture more images or video, or to zoom in on an element in the video so that more information can be captured about the element. In some embodiments, the instructions can be provided as a list of instructions via the application or email or some other format.

In some embodiments, the sensor information provided by the user device 114 can also include metadata from the user device 114. For example, the user device 114 can embed global positioning system (GPS), accelerometer, and or magnetometer data with the images, video, or other sensor information, which the energy modeling system 118 can analyze to determine additional energy-related information. For example, the energy modeling system 118 can use GPS data to determine a cardinal direction of the window 104 or a size of the facility 102 or a location of the facility 102 for climate, weather, and other information.

In some embodiments, the accelerometer produces data that indicates the distance between elements in the facility. For example, where GPS data establishes a reference position within the facility, accelerometer data may indicate where various elements are positioned relative to the reference position. Thus, in these embodiments, the energy modeling system 118 can determine the distance between windows, length of halls, location of loads, etc using accelerometer data.

In some embodiments, the sensor information provided by the user device 114 can include voice or text annotations from users. For example, the user can describe on a video elements that are being captured or provide additional information, such as characteristic information about the elements, which can be captured as audio on the video. In some embodiments, the instructions can include requests for information that can be provided by the user in voice or text responses. For example, the instructions can include questions about elements and characteristics of the facility, such as a capacity or occupancy of the facility, or whether there were additional lighting systems that have not been captured in images, video, or other sensor information which can be answered by responses from the user directly, rather than, or along with, additional images, video, or other sensor information. In some embodiments, the energy modeling system 118 can use natural language processing techniques to process text or voice responses to extract information.

In some embodiments, the energy modeling system 118 can also receive information related to energy usage of the facility 102 from secondary sources, which can include any source of information additional to the user and user device. For example, the energy modeling system 118 can receive from a weather service weather data, which can affect the energy usage by the facility 102. For example, the weather data can include outdoor temperature, humidity, solar isolation, and other weather information for the location of the facility 102, which can affect how much energy the facility 102 might use. Secondary sources can also include a utility billing service, which can provide energy consumption and cost data for the facility 102. Such data can include water, gas, electricity, and other resources and forms of energy used by the facility 102. Secondary sources can also include event calendars for activities scheduled to take place at the facility 102, which can provide information regarding occupancy levels. Secondary sources can also include municipal data about the site of the facility 102, such as how the site is zoned. Secondary sources can also include public data about a company using the facility 102, such as type of industry, standard industrial classification (SIC) of the company, and other relevant statistics from public sources.

The energy modeling system 118 can process the information received from the user device 114, additional user devices, or from secondary sources to generate a model of the facility 102. The model can include elements and properties of the facility 102 such as an estimate of square footage of the facility 102, number of floors, an estimate of occupancy, a manifest including number and type of various energy loads, equipment, and energy sources, and other elements and properties related to energy usage of the facility 102. In some embodiments, the energy modeling system 118 can generate confidence levels of accuracy with one or more of the elements of the model of the facility 102.

For instance, in some embodiments, the energy modeling system 118 can determine a confidence interval with reference to qualitative degrees of certainty that the energy modeling system 118 has correctly identified one or more elements. In these embodiments, elements that the energy management system 118 has identified based on non-direct data would be associated with a low confidence interval. Elements that the energy management system 118 has identified based on a combination of direct and non-direct data would be associated with a medium confidence interval. Elements that the energy management system 118 has identified based on direct data would be associated with a high confidence interval. Elements that the energy management system 118 has identified based on user validated data would be associated with a highest confidence interval.

In another embodiment, the energy modeling system 118 can determine a confidence interval by comparing measurement data captured from the facility to measurement data captured from other facilities, simulated tests, or other benchmark sources. In these embodiments, the energy modeling system 118 may identify a type of an element in the facility (e.g., a lighting fixture) and may establish a confidence interval that the element is correctly identified by comparing the energy consumption of the element to a benchmark estimate for elements of the identified type. The degree of confidence may be directly proportional to the degree of similarly between the energy consumption of the element and the energy consumption reflected in the benchmark.

In some embodiments, the energy modeling system 118 can take actions based on the confidence levels of the elements. For example, the energy modeling system 118 can generate instructions for additional information about elements for which the confidence level is below a threshold. The energy modeling system 118 can also provide the model of the facility 102 to the user or other users of the facility 102 so that the users can update or revise the model of the facility 102. The model can be provided to the users with the corresponding confidence levels of the elements so that the users can edit or confirm those elements with lower confidence levels. The energy modeling system 118 can also provide images, video, or other sensor information of elements for which confidence level is below a threshold to request additional information about the elements in the images, video or other sensor information.

In some embodiments, the energy modeling system 118 generates an energy performance model of the facility 102. The energy modeling system 118 can generate the energy performance model based on the model of the facility 102. In some embodiments, the energy modeling system 118 can continue generating instructions and requesting further information about elements and characteristics of the facility 102 until the confidence levels of the accuracy of the model of the facility 102 is above a threshold. For example, the energy modeling system 118 can compare an average or a weighted average of the confidence levels of the elements of the model to a threshold. Alternatively or additionally, the energy modeling system 118 can compare a minimum confidence level of the elements to a threshold.

The energy performance model can be generated by assessing the energy performance of the facility 102. For example, the energy modeling system 118 can calculate energy consumption per square foot of the facility 102 and compare the value against established benchmarks for similar facilities. The energy consumption can also be compared to past usage of the facility 102 based on historical data or stored measurements by the energy modeling system 118. Other appropriate metrics measuring energy consumption can be used. The energy modeling system 118 can generate and provide recommendations for improving energy performance of the building. For example, the energy modeling system 118 can suggest replacing light fixtures that might be less efficient than other available options.

The energy performance model can include time elements, such as energy performance at different times of the day, different days of the week, different times of the year, and other such time elements. For example, energy usage at the facility 102 can be considerably lower at night versus the day, or the weekend over the weekday. The energy modeling system 118 can continue to receive data and information to update either or both the model of the facility 102 and the energy performance model. The energy modeling system 118 can also continue to provide requests and instructions for additional information to update either or both the model of the facility 102 and the energy performance model. In some embodiments, incentives can be provided to users to provide information requested by the energy modeling system 118. For example, the energy modeling system 118 can provide a simulation component that allows multiple users to compete in providing information to the energy modeling system 118.

In some embodiments, the energy performance model and information determined by the energy performance model can be presented to the user. For example, the energy modeling system 118 can present the model of the facility 102 to the user and energy consumption levels for components or elements of the facility 102. In some embodiments, such information can be displayed using augmented reality interfaces. For example, the user device 114 can display elements at which the user is directing the user device 114. The energy modeling system 118 can display on or near the element on the user device 114 information about the elements, such as energy consumption or characteristics of the element. Such information could also be displayed via user devices such as augmented glasses or other such user devices.

Figure 2:
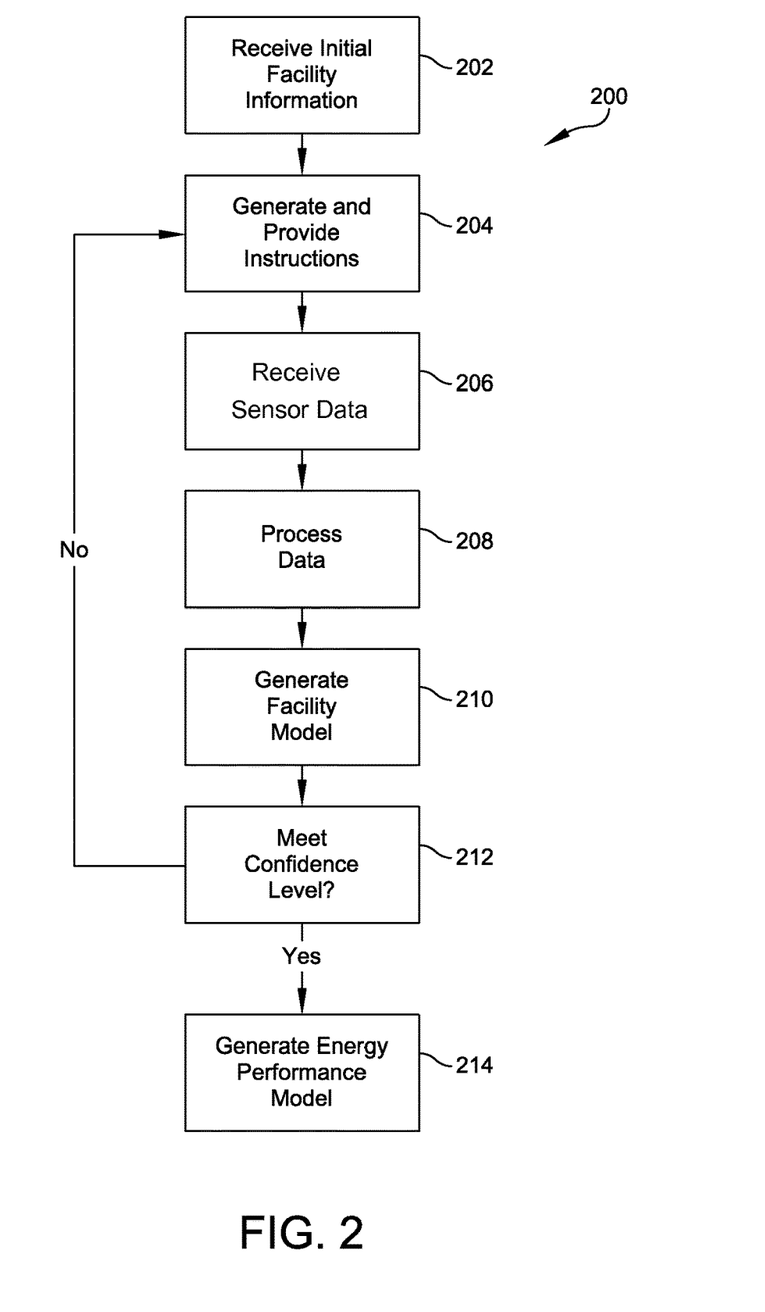
FIG. 2 is a flow chart of an example process performed by an energy modeling system.

FIG. 2 is a flow chart of an example process 200 of the energy modeling system 118. At act 202, the energy modeling system 118 receives initial facility information. Initial facility information can include information such as a name for the facility, an address, a primary activity of the facility, and other such basic information about the facility.

At act 204, the energy modeling system 118 generates and provides instructions. The instructions can be based upon the initial facility information. For example, different sets of instructions can be provided for different primary activities of the facility. For example, instructions for capturing information about a warehouse can be different from instructions for capturing information about an office building. The instructions can be provided to one or more users. The instructions provided to the users can be the same set of instructions or different sets of instructions. For example, the energy modeling system 118 can provide instructions for different sections of a facility to different users. In some embodiments, instructions can be based on information about the users. For example, instructions can be based on an area of the facility in which the user works or generally accesses, which can be determined from GPS information. Instructions can also be based on roles or access permissions of the user. For example, certain sections of the facility can have restricted access. Instructions for obtaining information about restricted areas can be provided to users who have access to the restricted areas.

At act 206, the energy modeling system 118 receives sensor information descriptive of a facility, such as images videos audiovisual data, acoustic data, infrared data, ultraviolet data, WIFI strength data, EMF data, airflow data, humidity data, pressure data, and particulate data. For example, the energy modeling system 118 can receive images, video, or other sensor information from users in response to the instructions provided to the users. The information and images, video, or other sensor information can pertain to elements, characteristics, and properties of the facility as described above.

At act 208, the energy modeling system 118 processes the received data. The images, video, or other sensor information can be processed using image processing and natural language processing techniques to detect elements, characteristics of elements, or properties of the facility in the images or videos. The data can also be processed to interpret voice or text data to identify information pertaining to elements, characteristics, and properties.

At act 210, the energy modeling system 118 generates a facility model. The facility model can include the elements detected in the images, video, or other sensor information received from the users. The facility model can also include a confidence level in the accuracy of the model. The confidence level can be of individual elements and characteristics or more generalized measures of confidence in the facility model.

At act 212, the energy modeling system 118 compares the confidence level of the facility model to a threshold. For example, the threshold can be a minimum confidence level that each of the elements detected in the facility model needs to meet. Additionally or alternatively, different elements can have different threshold levels, such as based on functional types of the elements. Additionally or alternatively, an overall average confidence threshold can also be used. If the confidence level does not meet the threshold, the energy modeling system 118 can generate and provide further instructions at act 204. The additional instructions can be focused on elements for which the confidence level does not meet the threshold. The additional instructions can include requests for additional images, video, or other sensor information or requests for confirmation of information extracted from the images or video. If the confidence level does meet the threshold, the energy modeling system 118 generates an energy performance model at act 214.

The energy performance model can include an assessment of the energy performance of the facility. The energy modeling system 118 can also provide additional information including calculations of the energy performance assessment or recommendations for improving energy performance for the facility.

For example, in some embodiments, the energy performance model can automatically track performance of an energy management investment in the facility. Examples of energy management investments include changing equipment from less energy efficient to more energy efficient models, such as upgrading light bulbs used in the facility. In response to detecting that the energy management investment has been made (e.g., the light bulbs in the facility have been changed), the energy performance model presents comparison information with qualitative or quantitative metrics that indicate an amount of energy (and associated cost) saved by implementing an energy management investment. When calculating these metrics, the energy performance model may account for occupancy, outdoor temperature, or other biasing factors. Thus the comparison information presented by the energy performance model may indicate whether the actual savings associated with the energy management investment are equal the predicted savings associated with the energy management investment.

It is to be appreciated that the energy modeling system 118 can provide recommendations even with a low confidence interval and there is no requirement that the energy modeling system 118 have a specific confidence interval recommending an action.

Computer System

As discussed above, aspects and functions disclosed herein may be implemented as hardware or software on one or more of these computer systems. There are many examples of computer systems that are currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Consequently, examples are not limited to executing on any particular system or group of systems. Further, aspects may be implemented in software, hardware or firmware, or any combination thereof. Thus, aspects may be implemented within methods, acts, systems, system elements and components using a variety of hardware and software configurations, and examples are not limited to any particular distributed architecture, network, or communication protocol.

Figure 3:
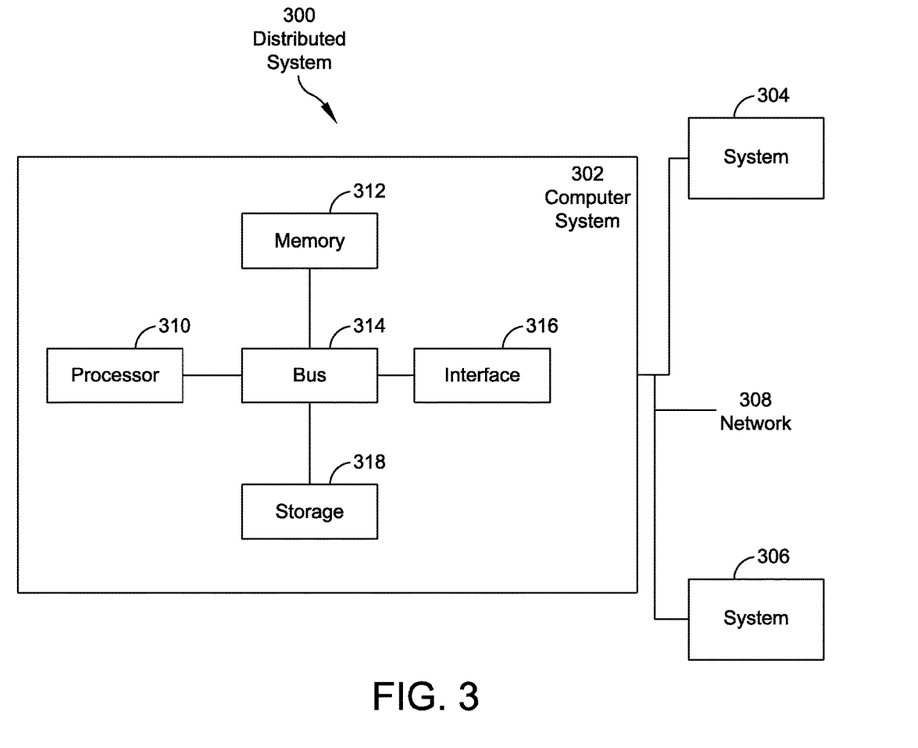
FIG. 3 is a block diagram of one example of a computer system that may be used to perform processes disclosed herein.

Referring to FIG. 3, there is illustrated a block diagram of a distributed computer system 300, in which various aspects and functions may be practiced. The distributed computer system 300 may include one more computer systems that exchange (i.e. send or receive) information. For example, as illustrated, the distributed computer system 300 includes computer systems 302, 304 and 306. As shown, the computer systems 302, 304 and 306 are interconnected by, and may exchange data through, communication a network 308.

The network 308 may include any communication network through which computer systems may exchange data. To exchange data using the network 308, the computer systems 302, 304 and 306 and the network 308 may use various methods, protocols and standards, including, among others, Fibre Channel, Token Ring, Ethernet, Wireless Ethernet, Bluetooth, IP, IPV6, TCP/IP, UDP, DTN, HTTP, FTP, SNMP, SMS, MMS, SS7, JSON, SOAP, CORBA, REST and Web Services. To ensure data transfer is secure, the computer systems 302, 304 and 306 may transmit data via the network 308 using a variety of security measures including, for example, TSL, SSL or VPN. While the distributed computer system 300 illustrates three networked computer systems, the distributed computer system 300 is not so limited and may include any number of computer systems and computing devices, networked using any medium and communication protocol.

As discussed above with regard to FIG. 1, various aspects and functions may be implemented as specialized hardware or software executing in one or more computer systems. FIG. 3 illustrates a particular example of the elements that may be included in the computer hardware 110 shown in FIG. 1. As illustrated in FIG. 3, the computer system 302 includes a processor 310, a memory 312, a bus 314, an interface 316 and data storage 318. The processor 310 may perform a series of instructions that result in manipulated data. The processor 310 may be a commercially available processor such as an Intel Xeon, Itanium, Core, Celeron, Pentium, AMD Opteron, Sun UltraSPARC, IBM Power5+, or IBM mainframe chip, but may be any type of processor, multiprocessor or controller. The processor 310 is connected to other system elements, including one or more memory devices 312, by the bus 314.

The memory 312 may be used for storing programs and data during operation of the computer system 302. Thus, the memory 312 may be a relatively high performance, volatile, random access memory such as a dynamic random access memory (DRAM) or static memory (SRAM). However, the memory 312 may include any device for storing data, such as a disk drive or other non-volatile storage device. Various examples may organize the memory 312 into particularized and, in some cases, unique structures to perform the functions disclosed herein.

Components of the computer system 302 may be coupled by an interconnection element such as the bus 314. The bus 314 may include one or more physical busses, for example, busses between components that are integrated within a same machine, but may include any communication coupling between system elements including specialized or standard computing bus technologies such as IDE, SCSI, PCI and InfiniBand. Thus, the bus 314 enables communications, for example, data and instructions, to be exchanged between system components of the computer system 302.

The computer system 302 also includes one or more interface devices 316 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow the computer system 302 to exchange information and communicate with external entities, such as users and other systems.

The data storage 318 may include a computer readable and writeable nonvolatile (non-transitory) data storage medium in which instructions are stored that define a program that may be executed by the processor 310. The data storage 318 also may include information that is recorded, on or in, the medium, and this information may be processed by the processor 310 during execution of the program. More specifically, the information may be stored in one or more data structures specifically configured to conserve storage space or increase data exchange performance. The instructions may be persistently stored as encoded signals, and the instructions may cause the processor 310 to perform any of the functions described herein. The medium may, for example, be optical disk, magnetic disk or flash memory, among others. In operation, the processor 310 or some other controller may cause data to be read from the nonvolatile recording medium into another memory, such as the memory 312, that allows for faster access to the information by the processor 310 than does the storage medium included in the data storage 318. The memory may be located in the data storage 318 or in the memory 312, however, the processor 310 may manipulate the data within the memory 312, and then copy the data to the storage medium associated with the data storage 318 after processing is completed. A variety of components may manage data movement between the storage medium and other memory elements and examples are not limited to particular data management components. Further, examples are not limited to a particular memory system or data storage system.

Although the computer system 302 is shown by way of example as one type of computer system upon which various aspects and functions may be practiced, aspects are not limited to being implemented on the computer system 302 as shown in FIG. 3. Various aspects and functions may be practiced on one or more computers having a different architectures or components than that shown in FIG. 3. For instance, the computer system 302 may include specially programmed, special-purpose hardware, such as for example, an application-specific integrated circuit (ASIC) tailored to perform a particular operation disclosed herein. While another example may perform the same function using a grid of several general-purpose computing devices running MAC OS System X with Motorola PowerPC processors and several specialized computing devices running proprietary hardware and operating systems.

The computer system 302 may be a computer system including an operating system that manages at least a portion of the hardware elements included in the computer system 302. Usually, a processor or controller, such as the processor 310, executes an operating system which may be, for example, a Windows-based operating system, such as, Windows NT, Windows 2000 (Windows ME), Windows XP, Windows Vista or Windows 7operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating systems available from various sources. Many other operating systems may be used, and examples are not limited to any particular implementation.

The processor 310 and operating system together define a computer platform for which application programs in high-level programming languages may be written. These component applications may be executable, intermediate, byte-code or interpreted code which communicates over a communication network, for example, the Internet, using a communication protocol, for example, TCP/IP. Similarly, aspects may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions may be implemented in a non-programmed environment, for example, documents created in HTML, XML or other format that, when viewed in a window of a browser program, render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used. Thus, functional components disclosed herein may include a wide variety of elements, e.g. executable code, data structures or objects, configured to perform described functions.

Based on the foregoing disclosure, it should be apparent to one of ordinary skill in the art that the disclosure is not limited to a particular computer system platform, processor, operating system, network, or communication protocol. Also, it should be apparent that the present disclosure is not limited to a specific architecture or programming language.

Having thus described at least one illustrative embodiment of the disclosure, various alterations, modifications and improvements will readily occur to those skilled in the art. Such alterations, modifications and improvements are intended to be within the scope and spirit of the disclosure. Accordingly, the foregoing description is by way of example only and is not intended as limiting. The disclosure's limit is defined only in the following claims and the equivalents thereto.

What is claimed is:

1. A system for improving energy usage of a facility, comprising:
   a memory device; and
   at least one processor coupled to the memory device and configured to:
   provide instructions to at least one sensor device for capturing images, videos or other sensor data pertaining to the facility, wherein the at least one sensor device is communicatively coupled to the system;
   generate, based on the images, videos or other sensor data captured by the at least one sensor device, and other information received from user devices or secondary sources, a model of the facility, the model of the facility including elements and properties identified from the data and other information relating to energy usage of the facility, the identified elements including elements that provide energy and elements that consume energy, and the identified properties including characteristics of the facility or associated with the facility that affect the energy usage of the facility including at least one of an estimate of square footage of the facility, number of floors in the facility, and an estimate of occupancy of the facility;
   generate confidence levels of accuracy with one or more of the elements of the model of the facility by determining a confidence interval with reference to qualitative degrees of certainty that the system has correctly identified the one or more elements, wherein elements the system has identified based on non-direct data is associated with a low confidence interval, elements the system has identified based on a combination of direct and non-direct data is associated with a medium confidence interval, elements the system has identified based on direct data is associated with a high confidence interval, and elements the system has identified based on user validated data is associated with a highest confidence interval;

take one or more actions based on the confidence levels of the elements, the actions including at least one of: generating instructions for additional information about the elements for which the confidence level is below a threshold, providing the model of the facility to the users with the corresponding confidence levels so the users can edit or confirm those elements with lower confidence levels, and providing images, video, or other sensor information of elements for which confidence level is below a threshold to request additional information about the elements in the images, video or other sensor information;

continue generating instructions and requesting further information about the elements and characteristics of the facility until the confidence levels of the accuracy of the model of the facility is above a threshold by at least one of: comparing an average or a weighted average of the confidence levels of the elements of the model to a threshold, and comparing a minimum confidence level of the elements to a threshold;

receive information pertaining to energy usage of the facility;

generate, based on the model of the facility and the information pertaining to energy usage of the facility, an energy performance model of the facility;

generate and provide recommendations for improving energy performance of the facility based on the energy performance model of the facility; and adjust or modify at least one component in the facility in response to the provided recommendations.

2. The system of claim 1, wherein the at least one processor is configured to receive information pertaining to energy usage of the facility by at least receiving information generated by a utility company.

3. The system of claim 1, wherein the at least one processor is further configured to:
provide data for displaying energy performance information on a user device, the energy performance information being superimposed on one or more elements as the user device receives image data from a camera and shows the element on a display of the user device.

4. The system of claim 1, wherein the at least one processor is configured to process the at least one video by at least identifying characteristics of the elements.

5. The system of claim 1, wherein the at least one portion of the information further includes audio comprising words descriptive of at least one of the elements.

6. The system of claim 1, wherein the recommendations for improving energy performance of the facility include specific recommendations for adjusting or modifying the at least one component in the facility.

7. The system of claim 1, wherein the at least one component in the facility includes at least one of the identified elements and properties related to energy usage of the facility.

8. A computer-implemented method for improving energy usage of a facility, comprising:

providing instructions to at least one sensor device for capturing images, videos or other sensor data pertaining to the facility;

generating, on a system for improving energy usage of the facility, a model of the facility based on the images, videos or other sensor data captured by the at least one sensor device, and other information received from user devices or secondary sources, the model of the facility including elements and properties identified from the data and other information relating to energy usage of the facility, the identified elements including elements that provide energy and elements that consume energy, and the identified properties including characteristics of the facility or associated with the facility that affect the energy usage of the facility including at least one of an estimate of square footage of the facility, number of floors in the facility, and an estimate of occupancy of the facility, and a manifest including number and type of various energy loads, equipment and energy sources, and other elements and properties related to the energy usage of the facility;

generating confidence levels of accuracy with one or more of the elements of the model of the facility by determining a confidence interval with reference to qualitative degrees of certainty that the system has correctly identified the one or more elements, wherein elements the system has identified based on non-direct data is associated with a low confidence interval, elements the system has identified based on a combination of direct and non-direct data is associated with a medium confidence interval, elements the system has identified based on direct data is associated with a high confidence interval, and elements the system has identified based on user validated data is associated with a highest confidence interval;

taking one or more actions based on the confidence levels of the elements, the actions including at least one of: generating instructions for additional information about the elements for which the confidence level is below a threshold, providing the model of the facility to the users with the corresponding confidence levels so the users can edit or confirm those elements with lower confidence levels, and providing images, video, or other sensor information of elements for which confidence level is below a threshold to request additional information about the elements in the images, video or other sensor information;

continue generating instructions and requesting further information about the elements and characteristics of the facility until the confidence levels of the accuracy of the model of the facility is above a threshold by at least one of: comparing an average or a weighted average of the confidence levels of the elements of the model to a threshold, and comparing a minimum confidence level of the elements to a threshold;

receiving information pertaining to energy usage of the facility;

generating, based on the model of the facility and the information pertaining to energy usage of the facility, an energy performance model of the facility;

generating and providing recommendations for improving energy performance of the facility based on the energy performance model of the facility; and adjusting or modifying at least one component in the facility in response to the provided recommendations.

9. The method of claim 8, wherein receiving information pertaining to energy usage of the facility comprises receiving information generated by a utility company.

10. The method of claim 8, further comprising:
providing data for displaying energy performance information on a user device, the energy performance information being superimposed on one or more elements as the user device receives image data from a camera and shows the element on a display of the user device.

11. The method of claim 8, wherein the processing the at least one video comprises identifying characteristics of the elements.

12. The method of claim 8, wherein the at least one portion of the information further includes audio comprising words descriptive of at least one of the elements.

13. A non-transitory computer readable medium storing computer readable instructions that, when executed by at least one processor, instruct the at least one processor to perform a method for improving energy usage of a facility, the method comprising:
providing instructions to at least one sensor device for capturing images, videos or other sensor data pertaining to the facility;
generating, on a system for improving energy usage of the facility, a model of the facility based on the images, videos or other sensor data captured by the at least one sensor device, and other information received from user devices or secondary sources, the model of the facility including elements and properties identified from the data and other information relating to energy usage of the facility, the identified elements including elements that provide energy and elements that consume energy, and the identified properties including characteristics of the facility or associated with the facility that affect the energy usage of the facility including at least one of an estimate of square footage of the facility, number of floors in the facility, and an estimate of occupancy of the facility;
generating confidence levels of accuracy with one or more of the elements of the model of the facility by comparing measurement data captured from the facility to measurement data captured from other facilities, simulated tests, or other benchmark sources;
taking one or more actions based on the confidence levels of the elements, the actions including at least one of: generating instructions for additional information about the elements for which the confidence level is below a threshold, providing the model of the facility to the users with the corresponding confidence levels so the users can edit or confirm those elements with lower confidence levels, and providing images, video, or other sensor information of elements for which confidence level is below a threshold to request additional information about the elements in the images, video or other sensor information;
continue generating instructions and requesting further information about the elements and characteristics of the facility until the confidence levels of the accuracy of the model of the facility is above a threshold by at least one of: comparing an average or a weighted average of the confidence levels of the elements of the model to a threshold, and comparing a minimum confidence level of the elements to a threshold;
receiving information pertaining to energy usage of the facility;
generating, based on the model of the facility and the information pertaining to energy usage of the facility, an energy performance model of the facility;
generating and providing recommendations for improving energy performance of the facility based the energy performance model of the facility; and
adjusting or modifying at least one component in the facility in response to the provided recommendations.

* * * * *